United States Patent [19]
Ashuri et al.

[11] Patent Number: 6,071,003
[45] Date of Patent: *Jun. 6, 2000

[54] METHOD AND APPARATUS FOR LOCATING CRITICAL SPEED PATHS IN INTEGRATED CIRCUITS USING A CLOCK DRIVER CIRCUIT WITH VARIABLE DELAY

[75] Inventors: Roni Ashuri, Yaakov; Ernest Knoll, Haifa, both of Israel

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/774,517

[22] Filed: Dec. 30, 1996

Related U.S. Application Data

[63] Continuation-in-part of application No. 08/616,073, Mar. 14, 1996, abandoned.

[51] Int. Cl.[7] .............................. G06F 17/00; G06F 17/50
[52] U.S. Cl. ............................ 364/490; 364/489; 364/488
[58] Field of Search ..................... 364/488, 489, 364/490, 491; 326/113, 93, 99, 16, 21

[56] References Cited

U.S. PATENT DOCUMENTS

| | | | |
|---|---|---|---|
| 5,095,454 | 3/1992 | Huang | 364/578 |
| 5,455,931 | 10/1995 | Camporese et al. | 395/550 |
| 5,489,864 | 2/1996 | Ashuri | 327/161 |
| 5,497,263 | 3/1996 | Masuda et al. | 327/278 |
| 5,652,530 | 7/1997 | Ashuri | 326/93 |
| 5,699,003 | 12/1997 | Saeki | 327/261 |
| 5,705,942 | 1/1998 | Ashuri | 326/93 |

*Primary Examiner*—Kevin J. Teska
*Assistant Examiner*—Vuthe Siek
*Attorney, Agent, or Firm*—Blakely, Sokoloff, Taylor & Zafman LLP

[57] ABSTRACT

A method and apparatus for locating a critical speed path in an integrated circuit. The operating frequency of the integrated circuit is increased until a logic error occurs in the integrated circuit. The propagation time of one clock signal within a circuit subblock of the integrated circuit is then increased until the logic error is eliminated. The propagation time of the clock signal is increased by enabling a delay circuit comprising a capacitor coupled to the clock signal. Another embodiment of the clock signal comprises a circuit that introduces contention on the clock signal line.

1 Claim, 4 Drawing Sheets

FIG. 4

| Flip - Flop | Data Out | | | | | | | |
|---|---|---|---|---|---|---|---|---|
| | $\phi$ | $\phi$+1 | $\phi$+2 | $\phi$+3 | $\phi$+4 | $\phi$+5 | $\phi$+6 | $\phi$+7 |
| FF1 | 0 | 0 | 0 | 0 | 1 | 1 | 1 | 1 |
| FF2 | 0 | 0 | 1 | 1 | 0 | 0 | 0 | 0 |
| FF3 | 0 | 1 | 1 | 1 | 1 | 1 | 1 | 1 |
| FF4 | 1 | 0 | 0 | 0 | 0 | 0 | 1 | 1 |
| FF5 | 0 | 1 | 1 | 1 | 1 | 0 | 0 | 0 |
| FF6 | 1 | 1 | 0 | 0 | 0 | 0 | 0 | 1 |
| FF7 | 1 | 1 | 1 | 1 | 0 | 0 | 1 | 1 |
| FF8 | 0 | 0 | 0 | 1 | 1 | 1 | 1 | 1 |
| FF9 | 1 | 1 | 0 | 0 | 1 | 1 | 1 | 0 |

Fault Occurs

METHOD AND APPARATUS FOR LOCATING CRITICAL SPEED PATHS IN INTEGRATED CIRCUITS USING A CLOCK DRIVER CIRCUIT WITH VARIABLE DELAY

This is a continuation-in-part of application Ser. No. 08/616,073 filed on Mar. 14, 1996 now abandoned.

FIELD OF THE INVENTION

The present invention is in the field of digital semiconductor electronic devices. Specifically, the present invention comprises a circuit and method for locating speed critical paths in digital semiconductor devices.

BACKGROUND OF THE INVENTION

Within every digital integrated circuit there is usually one data path between two circuit blocks that requires more time to propagate valid data than any other path between the circuit blocks. The data path that requires the longest time for the data signal to be propagated before it may be sampled is known as the critical speed path of the integrated circuit. Critical speed paths may be slow due, for example, to a greater number of device delays or greater signal travel distances.

The maximum speed at which the digital integrated circuit may operate is limited by the critical speed path in the digital integrated circuit. The reason for this is that the critical speed path presents the longest delay path and the clock rate cannot be increased beyond the point at which the clock cycle time is equal to the propagation delay of signals on the critical speed path.

Since the maximum speed of an integrated circuit is limited by the critical speed path of the integrated circuit, it is very desirable to be able to easily locate the critical speed path within an integrated circuit. However, in complex modern integrated circuits such as microprocessors there are millions of possible paths that may be the critical speed path. To locate the critical speed path among the millions of data paths in the integrated circuit, sophisticated design and testing tools are required.

SUMMARY OF THE INVENTION

A method and apparatus for locating a critical speed path in an integrated circuit is described. In one embodiment of the invention, the operating frequency of the integrated circuit is increased until a logic error occurs in the integrated circuit. The propagation time of one clock signal within a circuit subblock of the integrated circuit is then increased until the logic error is eliminated. A receiving subblock of a possible critical speed path is thus determined. Then the propagation time of a clock signal to a circuit subblock that is a source of signals for the previous circuit subblock is increased until a logic error occurs in the integrated circuit. A source subblock of a possible critical speed path is thus determined. A database of connections of the integrated circuit is searched to determine flip-flops of the receiving and source subblocks. Graphical output of a simulation of the integrated circuit is examined to determine which flip-flops changed state during the clock cycle in which the error occurred. Only paths including such flip-flops can be critical speed paths. The propagation time of the clock signal is increased by enabling a delay circuit comprising a capacitor coupled to the clock signal. Another embodiment of the delay circuit comprises a circuit that introduces contention on the clock signal line.

BRIEF DESCRIPTION OF THE DRAWINGS

The objects, features, and advantages of the present invention will be apparent from the following detailed description of the preferred embodiment of the invention with references to the following drawings.

FIG. 4 is an example of data obtained from a logic simulation of the integrated circuit.

DETAILED DESCRIPTION

A method and apparatus for locating critical speed paths within digital integrated circuits is disclosed. In the following description, for purposes of explanation, specific nomenclature is set forth to provide a thorough understanding of the present invention. However, it will be apparent to one skilled in the art that these specific details are not required in order to practice the present invention. In other instances, well known circuits and devices are shown in block diagram form in order not to obscure the present invention.

Within a digital integrated circuit, data is often shared between various logic circuits. The various logic circuits are connected to each other through defined data paths. For example, in FIG. 1 data path 187 carries information from flip-flop 7 (FF7) to flip-flop 33 (FF33). If logic circuitry 175 between flip-flop 7 and flip-flop 33 is sufficiently complex, a long propagation delay might be introduced causing the information that will be placed on data path 187 to be sampled before it is ready. If the speed of the clock driving the integrated circuit is increased beyond the propagation delay of the slowest data path, then the receiving flip-flop may sample the data before the data has propagated through the data path logic. In such a situation, the receiving flip-flop will receive incorrect data.

Within every digital integrated circuit there is usually one data path between two circuit blocks that requires more time to propagate valid data than any other path. The data path that requires the longest time for the data signal to be propagated before it may be sampled is known as the critical speed path of the integrated circuit. The maximum speed at which the digital integrated circuit may operate is limited by the critical speed path. To improve the performance of a digital integrated circuit, a designer must first be able to locate the critical speed path.

After locating the critical speed path, inefficient logic may be redesigned or routing may be changed to improve the speed of the path. The present invention introduces methods that simplify the task of locating the critical speed path within a digital integrated circuit.

Figure 1:
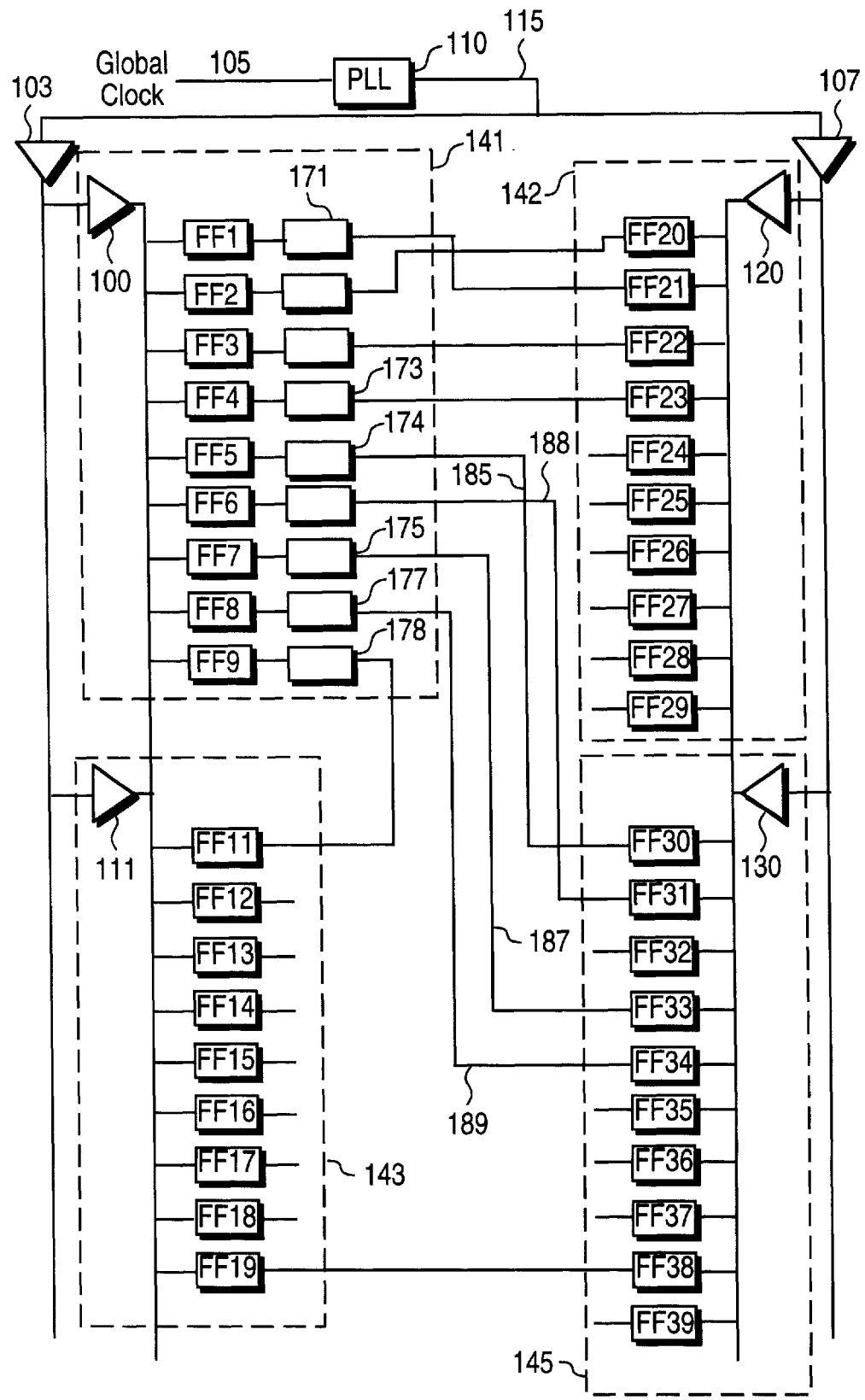
FIG. 1 illustrates a block diagram of a highly integrated digital integrated circuit.

FIG. 1 illustrates a block diagram of a typical clock distribution system for use within a digital integrated circuit. An external clock signal driven by a crystal or other means is introduced into the integrated circuit on external clock line 105. External clock line 105 enters a phase lock loop circuit 110 or other clock generator that drives main clock signal 115 within the integrated circuit.

The digital integrated circuit of FIG. 1 is divided into several circuit subblocks. Each circuit subblock provides some functionality for the integrated circuit. Main clock signal 115 is distributed to several subblock clock drivers (103 and 107) that drive the clock signal within the various circuit subblocks. The subblock clock drivers (103 and 107) strengthen the clock line signal in order to drive a large fan-out of local circuits within each subblock.

Within each subblock are several local block circuits (141, 142, 143, and 145). The strengthened clock line is supplied to a local clock driver (100, 120, 111, and 130) within each local block (141, 142, 143, and 145 respectively). Each local clock driver drives a clock signal for the circuits within its local block circuit.

Figure 2:
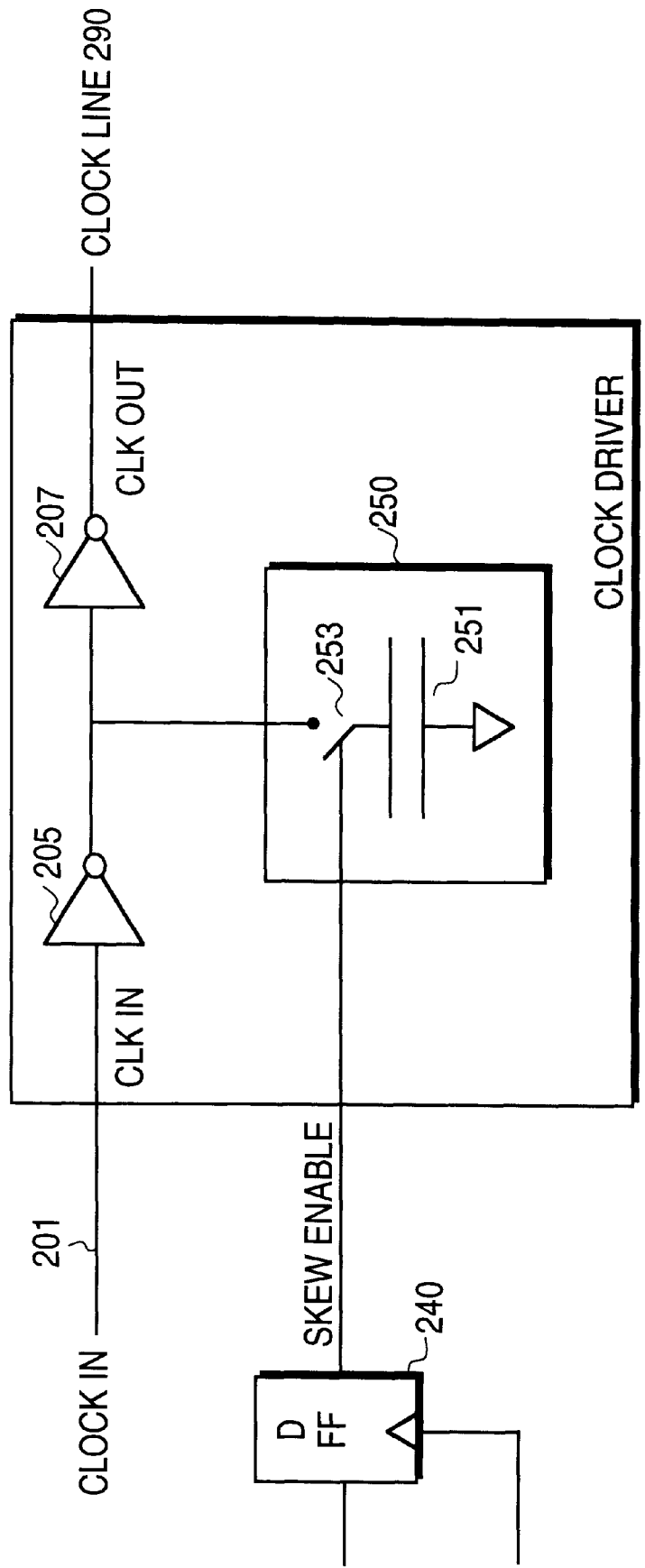
FIG. 2 illustrates a circuit diagram of one embodiment of a clock driver with a controllable delay according to the present invention.

To initially limit the possible data paths that are causing a critical speed path, it is recommended that controllable clock driver circuits be provided that can introduce delays onto the clock line within a subblock or a local block. FIG. 2 illustrates an embodiment of a controllable clock driver for use with the present invention.

The clock driver of FIG. 2 comprises two inverters 205 and 207 arranged in series. Other embodiments could include more than two inverters in series. The clock driver of FIG. 2 also includes a delay circuit 250. Delay circuit 250 comprises switch 253 and capacitor 251. Switch 253 is controlled by D flip flop 240. A skew enable output of D flip flop 240 enables or disables delay circuit 250. When delay circuit 250 is disabled, the clock driver is disconnected from delay circuit 250 and operates normally. When delay circuit 250 is enabled, the signal generated by the clock driver is delayed, or skewed, by delay circuit 250. When the skew enable output of D flip flop 240 is active, switch 253 is closed such that the line between inverters 205 and 207 is connected through capacitor 251 to ground. When the line between inverter 205 and inverter 207 is connected through capacitor 251 to ground, additional time is required to build up charge before the signal is propagated by inverter 207. Thus, the time required for the clock driver to propagate a clock signal on clock line 290 is increased.

Figure 3:
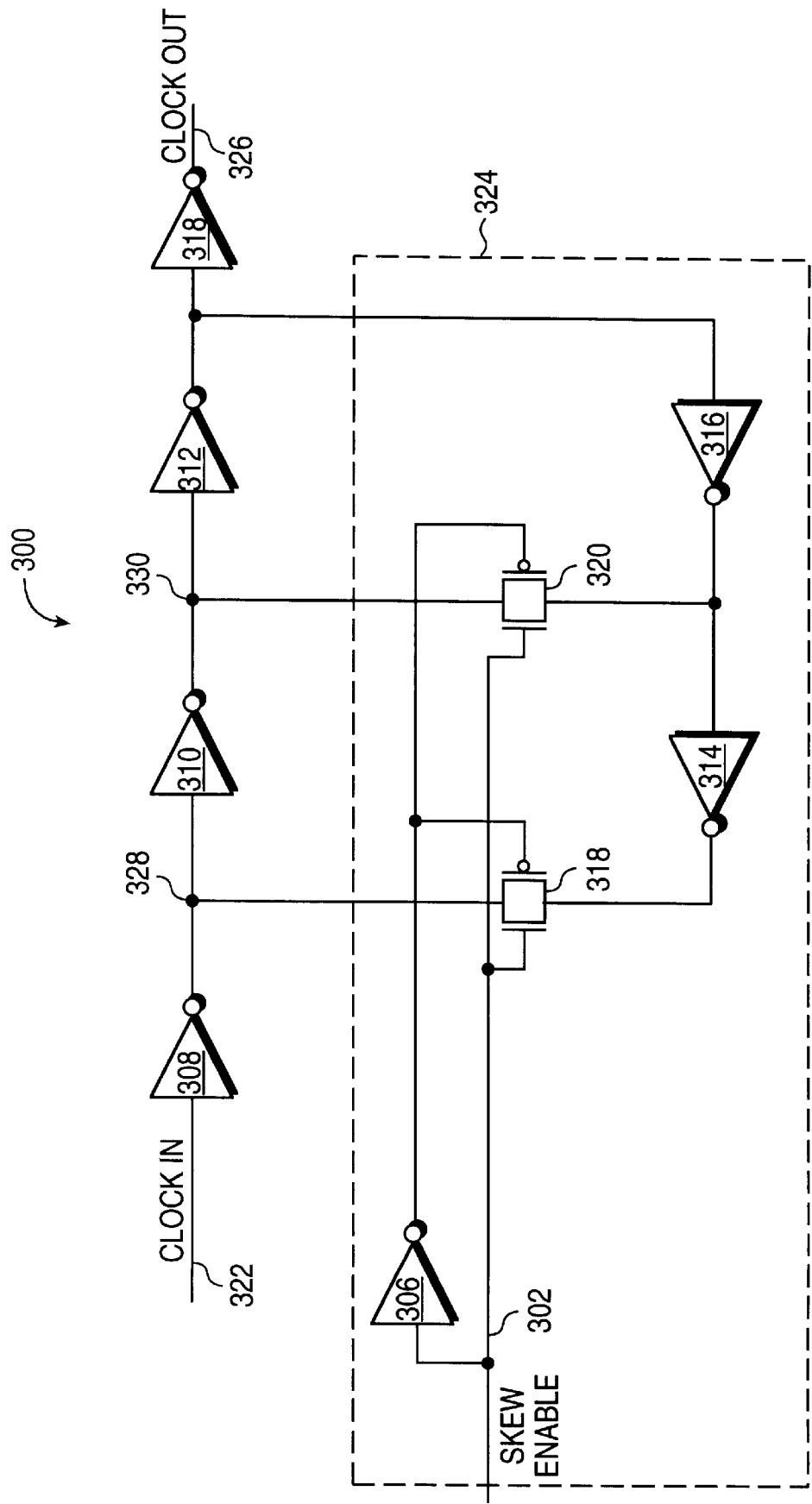
FIG. 3 illustrates a circuit diagram of another embodiment of a clock driver with a controllable delay according to the present invention.

FIG. 3 is a circuit diagram of clock driver circuit 300, which is an embodiment of the present invention in which contention is used to delay a clock signal. A clock signal is input to circuit 300 on line 322. As will be shown, when skew enable input 302 is inactive, delay circuit 324 has no effect on the remainder of clock driver circuit 300. Therefore, when skew enable input 302 is inactive, the clock signal on line 322 passes through inverters 308, 310, 312 and 318 and appears, inverted, on clock out line 326. When skew enable input 302 is disabled, a high logic value appears on the p-type transistors of pass gates 318 and 320. In addition, an inactive skew enable signal is inverted by inverter 306 and appears as a low logic value on the n-type transistors of pass gates 318 and 320. In this way, pass gates 318 and 320 are turned off by an inactive signal on skew enable input 302. When pass gates 318 and 320 are turned off, signals on the outputs of inverters 314 and 316 are not passed to nodes 328 and 330. Therefore, an inactive skew enable input isolates delay circuit 324 from the remainder of clock driver circuit 300.

When skew enable input 302 is active, a high logic value appears on the n-type transistors of pass gates 318 and 320. In addition, a low logic value appears on the p-type transistors of pass gates 318 and 320. Pass gates 318 and 320 are thus turned on, allowing signals on the outputs of inverters 314 and 316 to pass to nodes 328 and 330. This produces a situation in which inverters 308 and 314 contend to drive inverter 310 and inverters 310 and 316 contend to drive inverter 312. For example, when a high logic value appears on node 328, it is inverted by inverter 310 and appears on node 330 as a low logic value. The low logic value on node 330 passes through pass gate 320, is inverted by inverter 314, passes through pass gate 318 and appears as a high logic level at node 328. Inverters 310 and 314 introduce gate delays that slow the propagation of signals passing through them. For this reason, when the logic value on node 328 changes due to a new signal originating from clock input line 322, inverter 314 will still be attempting to drive a previous logic value of the opposite sense with respect to the new signal onto node 328. For the time it takes the new logic value to propagate through inverters 310 and 314, there will be contention at node 328. The contention is eventually resolved because inverter 308 is designed to have more drive than inverter 314, which drives signals through pass gate 318. Contention at node 330 is introduced and resolved in a similar manner to the contention at node 328. The length of delay to the clock signal in this embodiment is on the order of tenths of nanoseconds. Small adjustments to the operation of delay circuit 324 can be made by adjusting the sizes of n-type and p-type transistor making up inverters 310, 312, 318 and 320.

If clock drivers in a digital integrated circuit contain delay circuits such as that of FIG. 2 or of FIG. 3, then the critical speed path of the digital integrated circuit can be localized. To localize the critical speed path the following steps are performed:

Step 1. Slowly increase the operating frequency of the digital integrated circuit until the digital integrated circuit fails. This speed exceeds the limits of the critical speed path.

Step 2. Turn on the skew enable for one clock driver in the digital integrated circuit and then test the digital integrated circuit.

Step 3. If the digital integrated circuit now functions properly, then you have located the clock driver that clocks the receiving flip-flop of the critical speed path. Otherwise, turn on the skew enable for a different clock driver in the digital integrated circuit and return to Step 2.

Step 4. Having identified the receiving clock driver and flip-flop of the critical speed path, the source clock driver and source flip-flop of the critical speed path must be found. Keeping the skew enable on for the receiving clock driver, turn on the skew enable for another clock driver that clocks a flip-flop that sends data signals to the receiving flip-flop.

Step 5. If the digital integrated circuit now malfunctions, then you have located the source clock driver and source flip-flop of the critical speed path. Otherwise, turn on the skew enable for a different clock driver that clocks a flip-flop that sends data signals to the receiving flip-flop and return to Step 4 until the source clock driver is found.

As specified in the steps above, a person debugging an integrated circuit with the improved local clock drivers must be able to turn the skew enable on and off for all the various local clock drivers. Thus, the digital integrated circuit must be designed such that the skew enable for the local clock drivers are independently addressable.

After following the previously described steps, both the source block and the destination block of the critical speed path are located. However, a large number of data paths between the source block and the destination block could be the critical speed path. For example, referring to FIG. 1, if the critical speed path was localized to be somewhere between the flip-flops clocked by clock driver 103 and the flip-flops clocked by clock driver 107, any one of a large number of paths between clock driver 103 and clock driver 107 could be the critical speed path.

After localizing the area that contains the critical speed path, the location of the critical speed path must be further defined by using integrated circuit design and testing tools.

To facilitate the design of complex integrated circuits many computer-aided design tools are used. The computer-aided design tools store information that define every aspect of the designed integrated circuit. For example a connection database contains information identifying all the connections between various flip-flops. The information in this database can be used in conjunction with the present invention to help locate a critical speed path within a digital integrated circuit.

After localizing the area that contains the critical speed path as existing between particular clock drivers, both the source clock driver that clocks the source of the critical speed path and a destination clock driver that clocks the destination of the critical speed path are known. The connection database is then searched to locate all data paths that originate at a flip-flop clocked by the source clock driver and terminate at a flip-flop clocked by the destination clock driver. These are the only possible critical speed paths.

For example, referring to FIG. 1 suppose that a critical speed path has been localized such that it is known to originate in a flip-flop clocked by clock driver 100 and to terminate in a flip-flop clocked by clock driver 130. By examining the connection database, it can be determined that the critical speed path must be data path 185, data path 187, data path 188, or data path 189 since those are the only data paths that connect source flip-flops clocked by clock driver 100 to destination flip-flops clocked by clock driver 130.

After decreasing the number of possible critical speed paths by using the connection database, another design tool is then used to further decrease the number of possible critical speed paths. Specifically, a logic simulation trace is examined.

When designing a complex integrated circuit, the entire integrated circuit is simulated on a computer before it is committed to silicon. The integrated circuit is simulated such that the output of every flip-flop during every clock cycle is known. FIG. 4 illustrates an example of some information from a logic simulation. In FIG. 4, time proceeds from left to right. The rows represent the state of various flip-flops during consecutive clock cycles.

To help locate the critical speed path, the exact time at which the critical speed path error occurs is identified on the logic simulation trace. In the example of FIG. 4, the critical speed path error occurs after clock cycle φ+5.

Errors related to critical speed path occur when the source flip-flop changes its output before it has been sampled properly by the destination flip-flop. Thus, only those source flip-flops that change state at the time the error occurred can be related to the critical speed path. Therefore, all data paths that do not include a changing source flip-flop are excluded from possibility.

In FIG. 4, between clock cycle φ+5 and clock cycle (φ+6, only flip-flop 4 and flip-flop 7 change state. Assuming that the source clock driver is clock driver 100 and the destination clock driver is clock driver 130, data path 173 coupled to flip-flop 4 cannot be the critical speed path. This is because data path 173 does not connect to a destination flip-flop clocked by destination clock driver 130. The critical speed path must therefore be data path 187 because it originates from a flip-flop clocked by the source clock driver, it terminates at a flip-flop clocked by the destination clock driver, and it is the only one of such data paths whose source flip-flip changed state when the error occurred.

The methods of the present invention do not yield exactly one possible critical speed path in every case, but do reduce the number of possible critical speed paths to a small number much more quickly and easily than prior methods. It is feasible to redesign such a small number of paths to eliminate the errors exposed in testing.

Although the present invention has been described in terms of specific exemplary embodiments, it will be appreciated that various modifications and alterations might be made by those skilled in the art without departing from the spirit and scope of the invention as set forth in the following claims.

What is claimed is:

1. An integrated circuit, comprising:

a global clock signal that sets an operating frequency of the integrated circuit;

a plurality of circuit subblocks each coupled together, with at least one data path through the plurality of circuit subblocks; and an apparatus that includes a plurality of clock drivers, each coupled to the global clock signal and to one of the plurality of circuit subblocks, each comprising a clock delay circuit, such that clock signals to individual circuit subblocks are delayed in order to isolate a critical speed path;

wherein each clock driver comprises an inverter circuit including at least two inverters coupled in a series such that a signal from the global clock is input to a first inverter in the series and output from a final inverter in the series, each clock driver comprising a first node between a first pair of inverters in the series a second node between a second pair of inverters in the series, and a third node between a third pair of inverters in the series, and wherein the clock delay circuit comprises:

a skew enable input coupled to a first inverter;

an output of the first inverter coupled to a p-type terminal of a first pass gate and to a p-type terminal of a second pass gate;

the skew enable input also coupled to n-type terminals of the first and the second pass gates;

a second inverter with an input coupled to the third node and an output coupled to the input of the first pass gate, the output of the first pass gate coupled to the second node;

a third inverter with an input coupled to an output of the second inverter and an output coupled to the input of the second pass gate, the output of the second pass gate coupled to the second node; and wherein when the skew enable input is active, the third inverter and the first inverter in the series drive the first node and the second inverter and an inverter following the first inverter in the series drive the second node.

\* \* \* \* \*